United States Patent [19]

Schoenthaler

[11] 3,760,142

[45] Sept. 18, 1973

[54] SOLDERING APPARATUS HAVING A NON-UNIFORM HEAT TRANSFER DISTRIBUTION

[75] Inventor: David Schoenthaler, Yardley, Pa.

[73] Assignee: Western Electric Company, Incorporated, New York, N.Y.

[22] Filed: July 31, 1972

[21] Appl. No.: 276,275

[52] U.S. Cl. .................... 219/85, 219/349, 219/228, 219/258, 219/462

[51] Int. Cl. .................... B23k 1/02

[58] Field of Search .................... 219/85, 347, 349, 219/354, 228, 461–463, 258

[56] References Cited

UNITED STATES PATENTS

| | | | |
|---|---|---|---|
| 3,509,317 | 4/1970 | Valsamakis | 219/347 X |
| 1,553,365 | 9/1925 | Colby | 219/258 X |
| 3,529,117 | 9/1970 | Costello | 219/85 |
| 3,098,922 | 7/1963 | Paxton | 219/258 X |
| 1,481,103 | 1/1924 | Lamb | 219/258 X |

*Primary Examiner*—R. F. Staubly
*Assistant Examiner*—L. A. Schutzman
*Attorney*—W. M. Kain et al.

[57] ABSTRACT

Radiantly heated tools are used for bonding leads to an array of circuit paths. The heat transfer characteristics of the tools over their area of contact with the leads and circuit paths cause a profile or contour to be formed which matches the heat capacity profile or contour of the array to the heat output contour of a heat source. The heat transfer contour of the tools may be obtained by varying parameters such as material, mass, density, specific heat and absorptivity over the contact area of the tools.

13 Claims, 5 Drawing Figures

SOLDERING APPARATUS HAVING A NON-UNIFORM HEAT TRANSFER DISTRIBUTION

BACKGROUND OF THE INVENTION

1. Field of the Invention

This invention relates to apparatus for heating an array of elements and, more particularly, to apparatus for heating an array of elements to cause simultaneously a series of bonds between the elements and a workpiece.

2. Description of the Prior Art

When bonding a plurality of articles, such as wires or leads, to a workpiece, such as a printed circuit board, the situation is often encountered in which a plurality of bonds are non-uniform in size, shape and spacing. For example, solder coated circuit paths on a printed circuit board may be of various widths and spacings. In order to properly bond wires or leads to the solder coated circuit paths, the bonds generally correspond in width and spacing to the circuit paths. If there is non-uniformity in the width and spacing of the circuit paths, then difficulty can experienced in transferring the proper amount of heat to the paths in order to reflow the solder coating and thereby create bonds with the leads. In addition, difficulty may be encountered when sources of heat are non-uniform resulting in non-uniform and uncontrolled transfers of heat.

The original technique for bonding leads to the type of high density circuitry considered in this application was to solder each lead individually. This, of course, was a time consuming, costly procedure. The speed of the operation was then increased by utilizing a plurality of soldering tools simultaneously brought into contact with the leads. However, this resulted in a bulky apparatus with which temperature control was difficult.

In order to improve the soldering operation, radiant heat was applied in lieu of using standard soldering tools by directing either infrared or white light through openings in a mask so as to impinge directly on the joints to be soldered. Control again proved difficult because of the high reflectivity of the fresh copper and solder and because the leads being soldered were not necessarily held securely in engagement with the circuit paths.

The deficiencies of direct radiant heat have been compensated for by apparatus for reflow soldering wherein radiant heat is directed onto metallic absorbers which are, in turn, engaged with the joints to be bonded. With this apparatus, heat is transferred to the joints by conduction rather than radiation, eliminating the problem of reflectivity and providing a way of holding the leads securely in engagement with the circuit paths. However, this method makes no provision for bonding leads to circuit paths where the circuit paths are distributed in a non-uniform array nor does it provide for correcting for heat transfer variations due to non-uniform sources of heat.

SUMMARY OF THE INVENTION

It is, therefore, an object of this invention to provide new and improved apparatus for bonding arrays of elements.

It is another object of this invention to provide new and improved apparatus for bonding simultaneously a non-uniform array of elements.

It is a further object of this invention to provide new and improved tools for bonding simultaneously non-uniform arrays of elements wherein the tools are non-uniform along their length so as to provide a constant temperature profile through utilizing a non-uniform array of heat transfer characteristics coordinated to correspond to the non-uniform array of elements.

It is still another object of this invention to provide new and improved tools for bonding arrays of elements wherein the tools compensate for non-uniform heat sources as well as for non-uniform arrays of the elements.

An additional object of this invention is to provide new and improved tooling to bond simultaneously a uniform or non-uniform array of elements wherein the tool is non-uniform along its length so as to provide a controlled temperature profile by using a non-uniform array of heat transfer characteristics coordinated to match the output of a non-uniform heat source to the heat capacity of the array of elements.

In accordance with these and other objects, one embodiment of the invention is designed to bond leads to a non-uniform array of circuit paths on a printed circuit board. The invention includes a tool which is non-uniform along its length and is radiantly heated by a quartz lamp, or the like. The tool is designed to transfer heat rapidly to areas where the circuit path density is high and relatively slowly to areas where the circuit path density is low. Non-uniformity in the heat transfer rate of the tool may be achieved by varying such parameters as the mass, density, material, absorptivity, geometry and specific heat of the tool along its length. These parameters also correct for non-uniform heat transfer from the heat source along its length.

BRIEF DESCRIPTION OF THE DRAWINGS

Other objects and advantages of the present invention will be apparent from the following detailed description when considered in conjunction with the accompanying drawings in which.

DETAILED DESCRIPTION

First Embodiment

Figure 1:
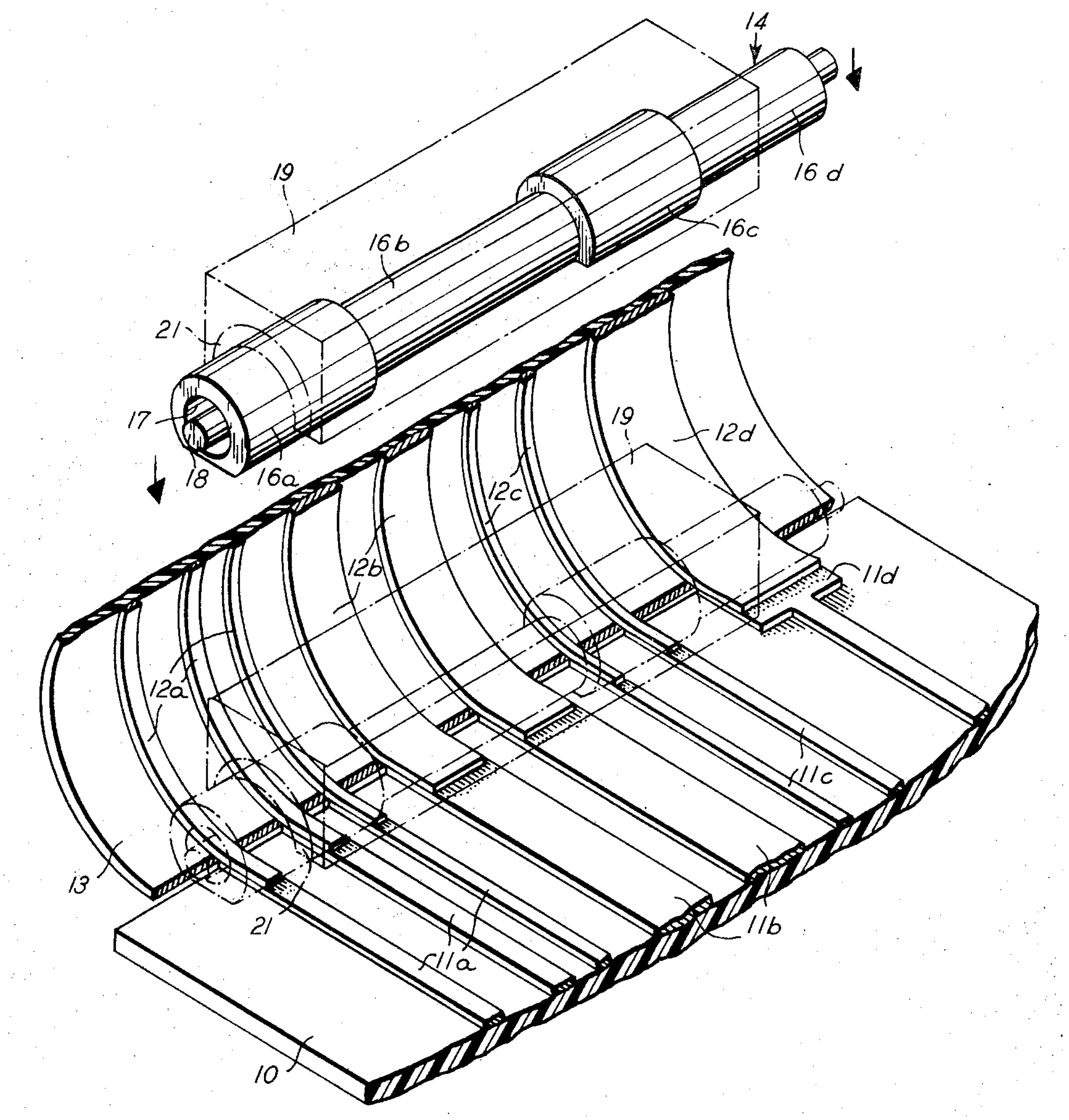
FIG. 1 is a perspective view of one embodiment of a heat transfer tool in accordance with the present invention illustrating the tool both out of engagement with and, in phantom, in engagement with leads being bonded to an array of circuit paths.

Referring now to FIG. 1, there is shown a printed circuit board 10 having a plurality of circuit paths 11*a*—11*a*, 11*b*—11*b*, 11*c*—11*c*, and 11*d*, sometimes referred to collectively as 11—11, of various widths and spacings. A plurality of leads 12a—12a, 12b—12b, 12c—12c, and 12d, sometimes referred to as 12—12, which are to be soldered to the circuit paths 11a—11a, 11b—11b, 11c—11c, and 11d, respectively, are juxtaposed therewith. For the sake of convenience and rapid alignment, the leads 12—12 are mounted on a tape 13.

As a general practice, the circuit paths 11—11 are coated with solder which may be highly reflective. The leads 12—12 may be made of copper which is also highly reflective. In order to bond the circuit paths 11—11 with the leads 12—12, it is necessary to melt or reflow the solder. Since the solder and the leads 12—12 are highly reflective, the solder reflow is most conveniently accomplished by engaging the leads 12—12 with a heating tool 14, which heats the solder by conduction while at the same time holding the leads in engagement with the circuit paths 11—11.

As mentioned before, the circuit paths 11—11 are of various widths and spacings. Consequently, the amount of heat needed to form bonds is not necessarily uniform from one circuit path to the next or from one group of circuit paths to the next since there are variations in mass distributions between various circuit paths resulting variations in circuit heat capacity. For example, more energy is needed to bond the leads 12b—12b to the paths 11b—11b than to bond the leads 12a—12a to the paths 11a—11a. This is because there is more solder to melt or reflow in the paths 11b—11b than the paths 11a—11a since the paths 11b—11b are wider, closer together, and have a greater cross-sectional area which results in more heat loss by conduction. Furthermore, in the illustrated embodiment, the circuit paths 11c—11c and 11d differ in width and spacing from both one another and also from the paths 11a—11a and 11b—11b thereby creating additional non-uniformity which must be contended with.

If one desires to bond all of the leads 11—11 to the circuit paths 12—12 properly, then just enough heat necessary to quickly reflow the solder of each circuit path must be applied. If too little heat is applied, the solder will not melt and no bond can be formed. If too much heat is applied, the solder might run too much and tend to bridge to adjacent circuit paths 11—11, or might not cool quickly enough after the source of heat has been removed. Too much heat will also destroy the heat sensitive printed circuit board 10 or the tape 13. Since the circuit paths 11—11 are non-uniform in spacing and width, various quantities of heat must be applied at different locations across the board 10. The tool 14 is configured to supply a non-uniform heat gradient along its length so as to supply the proper amount of heat to each of the circuit paths 11—11.

The tool 14 is shown divided into four segments 16a, 16b, 16c and 16d, sometimes referred to collectively as 16—16, each of which corresponds to an associated circuit path 11—11 or to a set of circuit paths in spacing and width. The divisions between segments 16a—16d do not have to be as abrupt as shown, but may be gradual instead. The tool 14 is hollow, or rather, has a chamber 17 extending therethrough which registers with each of the segments 16—16. Extending within the chamber 17 is heating element 18 which is preferably a quartz lamp that heats the tool 14 by impinging infrared radiation upon the inner surface of the chamber 17. In order to heat the tool 14 and reflow the solder to form bonds, the lamp 18 is pulsed while the tool 14 is pressing the leads 12—12 into engagement with the circuit paths 11—11.

Generally, the tool 14 should be made of a material such as molybdenum which has a low volumetric specific heat and a high absorptivity of thermal radiation so that the rate of decrease or increase of temperature can easily be controlled. In addition, a material such as molybdenum does not adhere to solder and therefore, will not become "wet" with solder as numerous bonds are effected. Finally, a material like molybdenum can be heat treated to produce an oxide surface having a high thermal radiation absorptivity which increases the heat transfer rate of the tool.

In order to control the temperature and heat transfer characteristics along the length of the tool 14, each segment 16 in the illustrated embodiment has a different mass and therefore exhibits a different heat transfer rate. Consequently, the tool 14 can have a heat transfer profile or contour which matches the thermal requirements of the circuitry when bonding the leads 12—12 to the circuit paths 11—11. Where there is a relatively large amount of solder to reflow, such as with the circuit paths 11b—11b and 11d, the segments 16b and 16d designed to heat these circuit paths may be relatively small in mass. Where there is a relatively small amount of solder to reflow, such as with the circuit paths 11a—11a and 11c—11c, the segments designed to heat these circuit paths may be relatively large in mass. Consequently, heat is transferred relatively rapidly to relatively large masses of solder and relatively slowly to relatively small masses of solder.

An additional problem encountered in trying to transfer the correct quantity of heat is non-uniformity of the heat generated by the heat source. In the embodiment of FIG. 1, the heat produced by the quartz lamp 18 may not be uniform along its length. For example, the heat generated along the middle portions of the lamp 18 may be significantly greater than that generated along the end portions. This variation may be compensated for by increasing the heat transfer rate of the tool 14 near its ends relative to the rate near its middle. In the illustrated embodiment, this compensation may be accomplished, for example, by increasing the mass of the tool 14 near its middle relative to the mass near its ends.

In designing the tool 14, variations in heat transfer rate due to non-uniformity of the source 11 should be taken into account and corrected first. Upon this first correction are superimposed corrections necessitated by the aforementioned variations in circuit path density.

By designing the tool 14 so that the segments 16—16 transfer heat at different rates, the solder in the various circuit paths may be made to reflow at the same rate. Consequently, the bonding operation can be controlled so that engagement by the tool 14 for a predetermined time will effect a bond. This enables automation of the soldering operation so that a sequence of boards 10 with identical arrays of circuit paths 11—11 can have leads 12—12 bonded thereto as the boards are indexed through a soldering station equipped with the tool 14.

The basic idea of the tool 14 is to achieve a definite heat transfer profile by segmenting the tool into zones in which the heat transfer rate differs. This may be accomplished by varying the mass of the segments 16—16, as shown in FIG. 1, or may be accomplished by other means such as using materials of different thermal conductivities, wall thicknesses, densities, specific heats or absorptions and by using different tool geometries. In order to achieve a specific profile, various combinations of the aforementioned properties may be incorporated in one tool.

Since heat transfer between two objects is affected by the pressure with which those objects are held together it is important that the pressure between the tool 14 and the leads 12—12 be as uniform as possible. This is accomplished by mounting the tool 14 in a support 19 which has a compliant lining 21 adjacent to the tool. The compliant lining 21 conforms to the shape of the tool 14 and can also be used as an adhesive to secure the tool to the support. The preferred material for the compliant liner is a high temperature elastomer, such as foamed silicon rubber. In order to simplify the design of the tool 14, it is advisable to form each segment 16 with a flat contact area 22 located in a plane with the contact areas of the other segments. Consequently, when the tool 14 is pressed into engagement with the leads 12—12 by applying a force to the support 19 as shown in phantom in FIG. 1, the leads 12—12 are pressed against the circuit paths 11—11 with a uniform pressure.

Graphical Explanation of the First Embodiment

Figure 2:
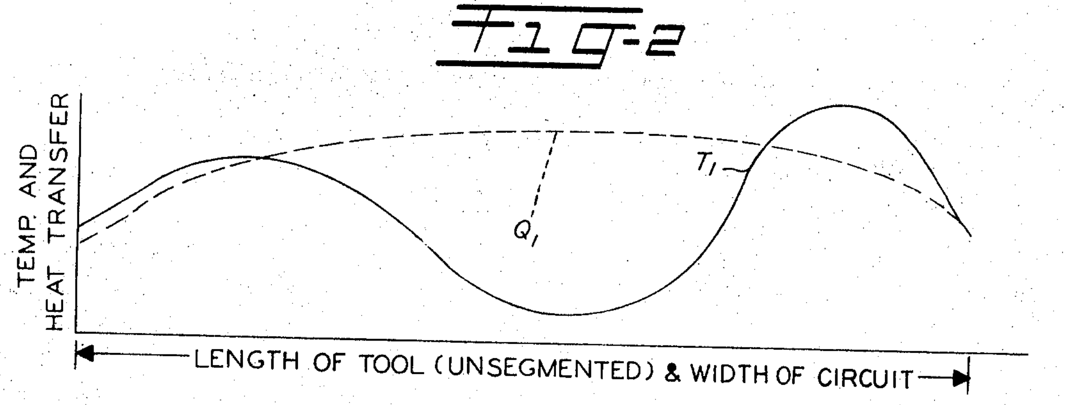
FIG. 2 is a graphical representation showing heat transfer characteristics and temperature inducing characteristics along the length of a uniform heat transfer tool when used to bond the leads to the circuit path array illustrated in FIG. 1.
Figure 4:
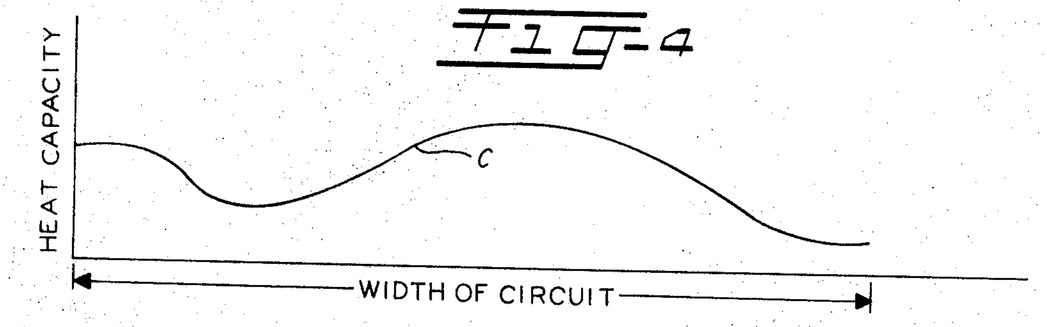
FIG. 4 is a graphical representation showing the heat capacity characteristics of the circuit path array of FIG. 1.

In FIG. 2, the heat transfer characteristics of a uniform heat transfer tool (not shown) and the resulting temperatures induced in the circuit path array 11—11 are plotted as a function of the tool's length and the width of the board 10. FIG. 4 plots the heat capacity curve C of the circuit path array 11—11 of FIG. 1 as a function of the width of the circuit board 10.

As seen in FIG. 2, a tool which is uniform along its length would transfer heat to the circuit path array 11—11 according to a curve $Q_1$. Depending upon heat loss from the circuit paths 11—11 and the uniformity of the heat source 18, this heat transfer curve $Q_1$ would generate temperatures in the circuit paths and leads 12—12 in approximation to a curve $T_1$. In the example of FIG. 2, the temperature curve $T_1$ has an opposite profile from the heat capacity curve C of FIG. 4. It should be noted that a high heat transfer rate can also result in a lowering of temperature $T_1$ when circuit paths 11—11 of high density cause extensive conductive losses. In any case, undulations in the curve $T_1$ illustrate that the solder connection between the paths 11—11 and leads 12—12 are not all heated to the same temperature. Consequently, during the soldering operation some joints become too hot and others not hot enough. This can cause the solder at some joints to remain hot too long, which tends to cause bridging and/or damage to the circuit board. On the other hand the solder at other joints may not be heated to a temperature sufficient to reflow it.

Attention is also drawn to the fact that a tool uniform along its length transfers less heat and is lower in temperature at and near its ends then in its middle. This characteristic is known as "end loss" or "edge effect." The heat source 18 also exhibits these end losses; hence, the tool 14 should be designed to correct for non-uniform generation of heat by the tool and from the source.

Figure 3:
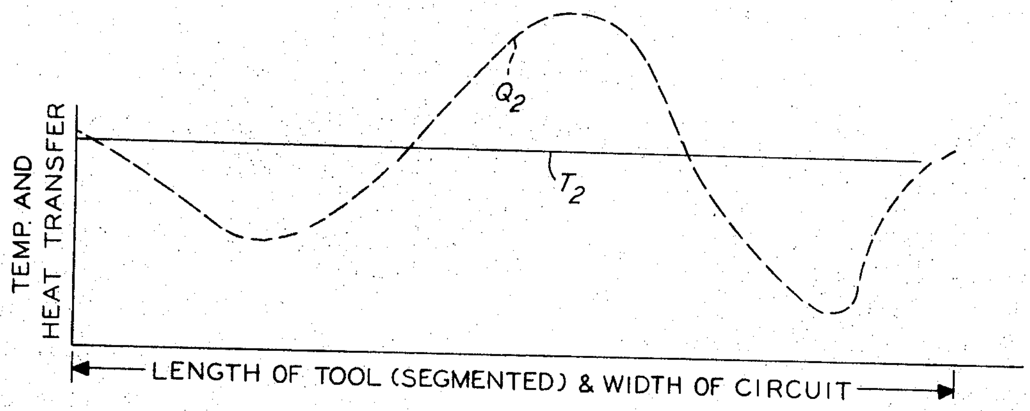
FIG. 3 is a graphical representation showing heat transfer characteristics and temperature inducing characteristics along the length of the non-uniform tool illustrated in FIG. 1 when used to bond the leads to the circuit path array illustrated in FIG. 1.

FIG. 3 illustrates the principles of the present invention by plotting heat transfer characteristics $Q_2$ of the non-uniform tool 14 in conjunction with temperatures $T_2$ induced in the circuit path array 11—11 as a function of the tools length and the width of the circuit board 10.

As seen in FIG. 3, the heat transfer profile $Q_2$ of the non-uniform tool 14 (FIG. 1) has been designed to achieve a flat temperature curve $T_2$. Typically, the sign of the slope of $Q_2$ generally follows the sign of the slope of the heat capacity curve C of FIG. 4. This is in order to counteract the undulations in temperature that are caused by the uneven distribution of the heat capacity C (FIG. 4) of the circuit paths 11—11 and leads 12—12 being soldered. The flat curve $T_2$ of course indicates that the solder at each joint is heated to the same temperature. As mentioned before, the proper profile may be obtained by altering various parameters such as mass, density, geometry, outside diameter, specific heat and absorptivity of the tool 14 along its length.

When a constant temperature $T_1$ is achieved, then it is a relatively simple matter to determine the period of time during which the tool 14 sould press the leads 12—12 into engagement with the paths 11—11. Consequently, automation of soldering processes can be easily achieved with the present invention.

Second Embodiment

Figure 5:
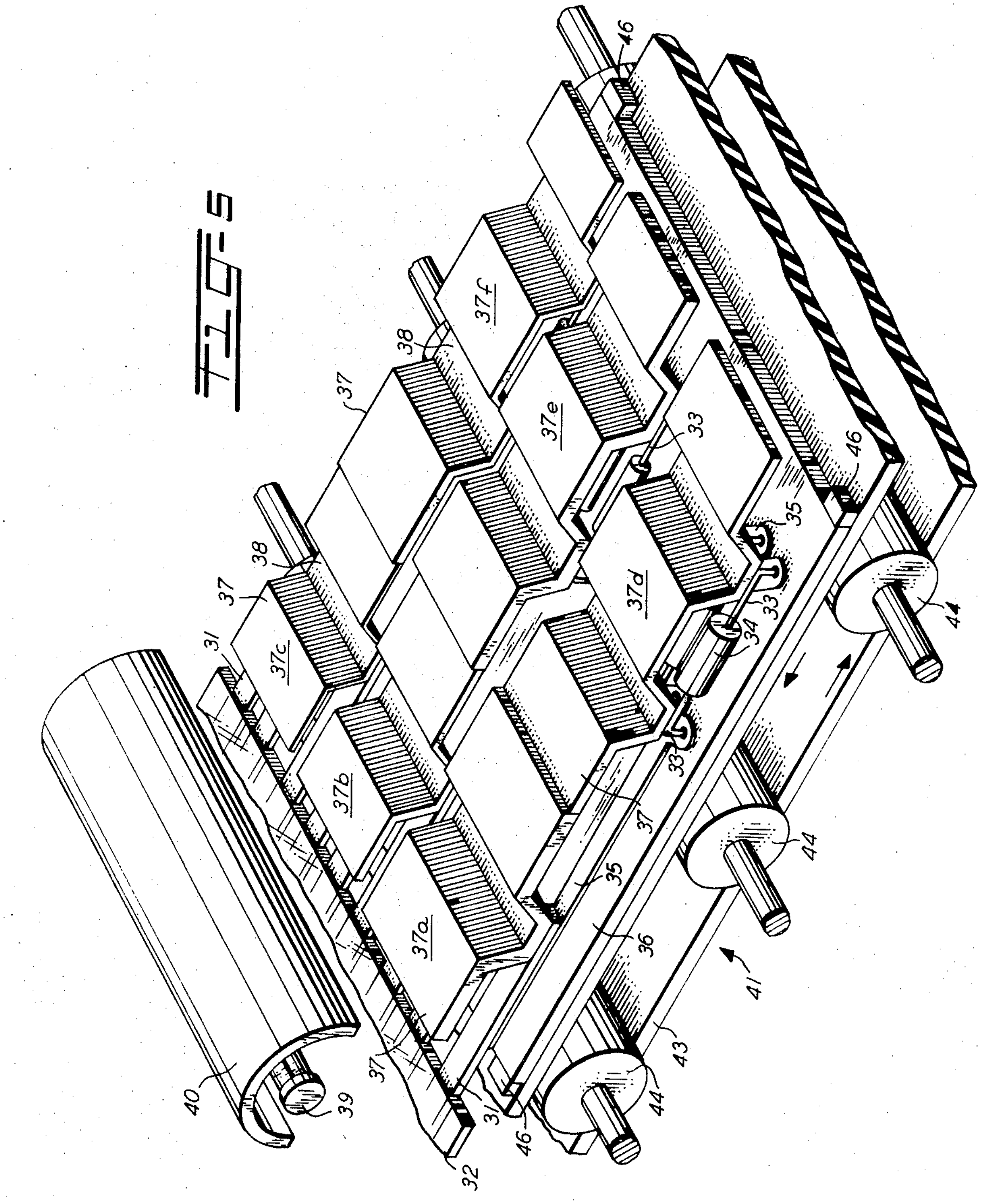
FIG. 5 is a perspective view of a second embodiment of a heat transfer tool configured in accordance with the present invention wherein a desired heat transfer contour is obtained by dividing a plate into sections having different heat transfer characteristics.

FIG. 5 illustrative of another embodiment of the invention in which it is desired to bond leads 31—31 extending from a tape 32 and leads 33—33 extending from components 34—34 to an array of solder coated circuit paths 35—35 on a printed circuit board 36. The bonds to be effected in FIG. 5 are distributed in a two dimensional array instead of in a one dimensional array as in FIG. 1. However, the same general principles are utilized to create the bonds.

In the embodiment of FIG. 5, plates, generally designated by the numerals 37—37, and made of heat conducting material such as molybdenum are used to conduct heat to the leads 31—31 and 33—33 and the circuit paths 35—35. The plates 37—37 need not be separate but could be joined together to form a single plate with no gaps between segments. In order to achieve adequate contact between the leads 31—31, 33—33 and the circuit paths 35—35, while providing adequate clearance for the various components 34—34, the plates 37—37 are formed with trough-like depressions 38—38 configured to rest on the leads where bonds are to be formed.

Like the tool 14 (FIG. 1) the plates 37—37 are segmented into sections *37a—37f* having different heat transfer characteristics matching the heat capacity profiles of the circuit paths 35—35 to which the leads 31—31 and 33—33 are to be bonded. In the specific embodiment of FIG. 5, the various segments *37a—37f* are shown to be of different masses, as illustrated by their different thicknesses. For example, section *37a* is thicker than section *37b* or section *37c* while section *37e* is thicker than sections *37d* or *37f* yet thinner than section *37a.* The thicker sections *37a* and *37e* transmit heat at a slower rate than do the thinner sections *37b, 37c, 37d* and *37f* and are therefore positioned to engage the leads 31—31 and 33—33 where the circuit density is relatively low. The thinner sections *37b, 37c, 37d* and *37f* tranfer heat at a higher rate than the thicker sections *37a* and *37e* and are therefore positioned to engage the leads 31—31 and 33—33 where the circuit density is relatively high.

The plates 37 are heated by a heat source such as an infrared lamp 39 which impinges infrared radiation onto the plates. In order to focus the radiation and thereby increase its intensity, a reflective shield 40 is positioned above the lamp 39. As with the embodiment of FIG. 1, the lamp 39 of FIG. 5 heats the plates 37 over an area extending generally across the plate along a line directly below the lamp. The heat of course spreads out from the line forming a heat band about the line. In designing the plates 37—37, additional adjustments in mass are included to allow for variations in the heat output profile of the lamp 38.

In order to provide a facility to sequentially solder leads 31—31 and 33—33 to the circuit paths 35—35 of a plurality of the printed circuit boards 36, a conveyor system, generally designated by the numeral 42, may be provided to move the boards beneath the lamp 38 in the direction of the arrow. The conveyor system 42 may consist of a continuous belt 43 supported by a plurality of rollers 44 and driven by a sprocket (not shown) or the like. Each individual board 36 may be positioned on the belt 43 by a pair of stops 46—46, one of which is disposed in front of and the other of which is disposed behind the board. The speed at which the board 36 moves relative to the lamp 39 is programmed so that each joint to be soldered receives just enough heat to form a bond. This is accomplished by advancing the boards 36 at a constant speed while depending on the variations in the heat transfer rate of the various sections **37*a*—37*f* of the plates 37—37** to transfer the proper amount of heat.

What is claimed is:

1. An apparatus for heating an array of elements having a definite heat capacity distribution to a substantially uniform temperature, comprising:

a heat source having a heat output of definite distribution; and means heated by said source for conducting heat to each element of the array wherein said means has a heat transfer distribution which matches the heat capacity distribution of the array to the heat output distribution of the source to thereby heat the array to a uniform temperature.

2. The apparatus of claim 1 wherein the heat transfer distribution of said heat conducting means is effected by a variation in at least one of the following properties of the heat conducting means: material, geometry, mass, density, specific heat and absorptivity.

3. The apparatus of claim 2 wherein the heat source output consists substantially of radiation.

4. The apparatus of claim 3 wherein the radiation is infrared radiation.

5. The apparatus of claim 1 wherein the heat conducting means has a recess therein in which the heat source is positioned.

6. The apparatus of claim 5 wherein the heat conducting means is abutted by a compliant member which is urged against the heat conducting means to insure uniform pressure by the contact surface against the elements to be bonded.

7. The apparatus of claim 1 further including means for moving the heat conducting means and heat source relative to one another.

8. Apparatus for bonding leads to locations on an array of solder coated circuit paths by reflowing solder coating the paths, comprising:

a heat source having a heat output of definite distribution, means heated by said source for conducting heat to the locations at which the leads are to be bonded wherein said means has a heat transfer distribution which matches the heat capacity distribution of the array to the heat output distribution of the source to thereby heat the array to a predetermined temperature at the locations at which the leads are to be bonded.

9. The apparatus of claim 8 wherein the heat conducting means is a plate which varies in thickness according to the amount of heat needed to be transferred to match the heat capacity of the array.

10. The apparatus of claim 8 wherein the heat conducting means is an elongated tool having a recess extending therein in which the heat source is located.

11. The apparatus of claim 8 wherein the heat source is an infrared lamp.

12. In an apparatus for boding leads to various locations on an array of solder coated circuit paths having a non-uniform distribution of heat capacities by heating the locations momentarily to reflow the solder; a tool for conducting heat to the locations, said tool being segmented into sections, said sections having different heat transfer characteristics, and said heat transfer characteristics of said sections generally matching the heat capacity of the locations to which the sections correspond to thereby heat the locations to a uniform temperature.

13. The apparatus of claim 12 wherein different heat transfer characteristics are achieved in said sections by a variation among the sections at least one of the following properties: material, geometry, mass, density, specific heat and absorptivity.

* * * * *